United States Patent [19]

Maple

[11] Patent Number: 5,215,866
[45] Date of Patent: Jun. 1, 1993

[54] BROADBAND PRINTED SPIRAL

[75] Inventor: Marshall Maple, San Jose, Calif.

[73] Assignee: Avantek, Inc., Santa Clara, Calif.

[21] Appl. No.: 523,066

[22] Filed: May 14, 1990

Related U.S. Application Data

[62] Division of Ser. No. 391,459, Aug. 9, 1989, Pat. No. 4,926,292.

[51] Int. Cl.[5] .................... G03F 7/26; H05K 1/16
[52] U.S. Cl. .................... 430/314; 430/311;
430/312; 430/313; 430/318; 430/319; 29/620;
427/96; 427/116; 427/125
[58] Field of Search .......... 430/311, 312, 313, 315,
430/319, 314, 316, 318; 29/620; 427/96, 116, 125

[56] References Cited

U.S. PATENT DOCUMENTS

| | | | |
|---|---|---|---|
| 4,016,519 | 4/1977 | Haas | 336/200 |
| 4,301,439 | 11/1981 | Johnson et al. | 29/620 |
| 4,482,874 | 11/1984 | Rubertus et al. | 333/185 |
| 4,604,160 | 8/1986 | Murakami et al. | 430/315 |
| 4,785,345 | 11/1988 | Rawls et al. | 357/51 |
| 4,959,705 | 9/1990 | Lemnios et al. | 357/51 |
| 5,014,018 | 5/1991 | Rodwell et al. | 333/20 |
| 5,039,964 | 8/1991 | Ikeda | 336/200 |

Primary Examiner—Marion E. McCamish
Assistant Examiner—Janis L. Dote
Attorney, Agent, or Firm—Christie, Parker & Hale

[57] ABSTRACT

A thin film printed circuit inductive element exhibiting low Q wherein a conductive spiral is deposited on an insulating substrate and resistive links are connected between adjacent turns of the spiral. Inherent resonance is thereby damped out.

9 Claims, 3 Drawing Sheets

BROADBAND PRINTED SPIRAL

This is a division of application Ser. No. 07/391,459, filed Aug. 9, 1989, now U.S. Pat. No. 4,926,292.

BACKGROUND OF THE INVENTION

1. Field of the Invention

The invention relates to printed circuit inductive elements and more specifically to reducing the inherent resonance of such devices.

2. Description of the Prior Art

The manufacture of printed circuit inductors is well known. See, e.g., Schweizerhof, U.S. Pat. No. 3,505,569, issued Apr. 7, 1970. The electrical magnitudes of such coils, i.e., inductance and Q, are determined primarily by the length of the winding, the path width, the spacing between paths and the average turn diameter. While the prior art has realized printed circuit coils having higher values of inductance than were initially achievable as well as methods of varying inductance values, an inherent resonance is present in such coils, limiting their usefulness.

SUMMARY OF THE INVENTION

It is an object of this invention to damp out the inherent resonance of a printed circuit spiral which acts as a lumped inductor at microwave frequencies. This and other objects can be achieved by connecting the turns of the spiral with low resistance links to produce a low Q.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE INVENTION

The word "spiral" as used herein is intended to include a broad class of structures which exhibit a clockwise or counterclockwise outwardly winding path beginning in a substantially centralized location, wherein each winding is successively longer than the previous winding. This definition is intended to include rectangular and circular spirals as well as any other irregular but generally spiraling shape.

Figure 1A:
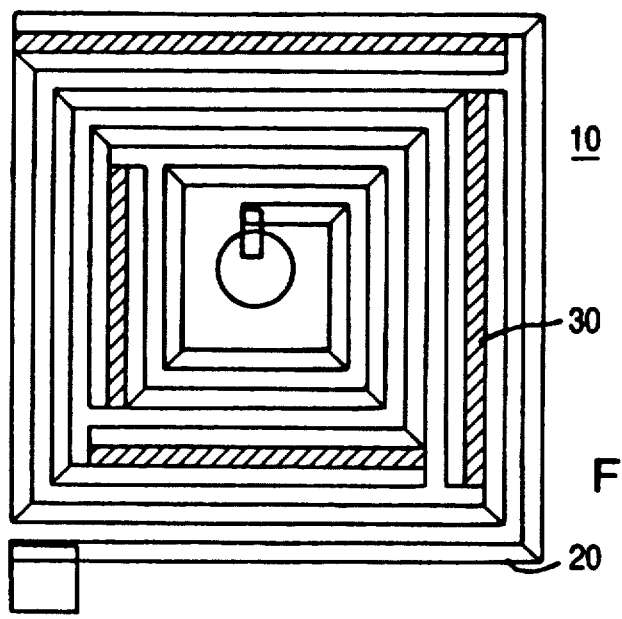
FIGS. 1A and 1B are plan views of a rectangular spiral conductor and a circular spiral conductor, respectively, on an insulating substrate with resistive links connecting adjacent turns of the spiral.
Figure 1B:
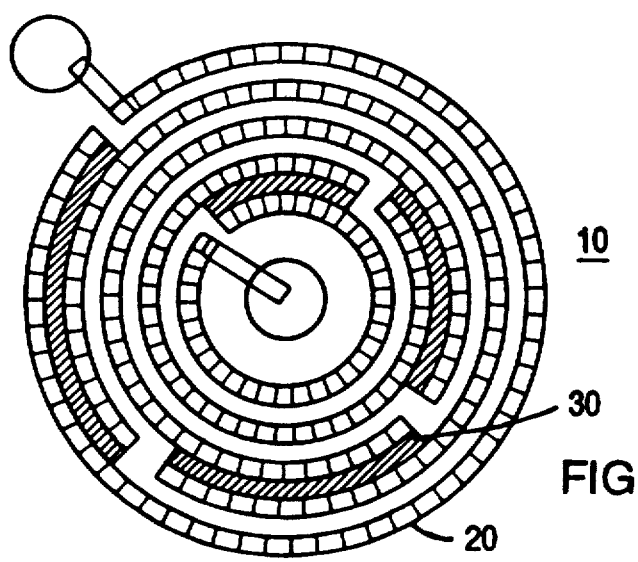

Two plan views of the invention are shown in FIGS. 1A and 1B. An insulating substrate material 10 forms the base on which a conducting spiral 20 is deposited. The length of the spiral determines the low frequency cutoff of the invention. A number of low resistance links 30 interconnect adjacent turns of the spiral 20. The length of the longest link governs the high frequency resonance of the invention.

Referring now to FIGS. 2A to 2E, the structures depicted in FIGS. 1A and 1B are formed by depositing a layer of electrically resistive material 40, such as tantalum nitride, to a thickness of between 400 to 600 Å on top of the insulating substrate 10. The thickness chosen should produce a resistivity of 30 $\Omega/\square$. Next, a layer 42 of titanium (Ti) is sputtered onto the substrate 10 followed by a layer 43 of platinum (Pt). In the preferred embodiment each layer 42 and 43 is approximately 2000 Å thick. (see FIG. 2A). In an alternate embodiment the Ti and Pt may be applied as an alloy in a single layer.

To define the pattern of the spiral, a layer 44 of photoresist is deposited over the Pt layer 43 and is exposed for the spiral pattern. The undeveloped, e.g. unexposed photoresist, is removed to reveal a spiral pattern 20 of the Pt layer 43. Gold 46 is electroplated onto the exposed spiral pattern to build up the thickness (see FIG. 2B). In the preferred embodiment the gold layer is approximately 160 minches. The remaining photoresist is then removed. The exposed part of the Pt layer 43 is then removed by a dry etch process.

A new layer 48 of photoresist is deposited over the entire surface of the device. This new layer is then exposed through a pattern which allows light to impinge on areas of the photoresist 50 over the locations of the resistors 30 (see FIG. 2C).

Figure 2A:
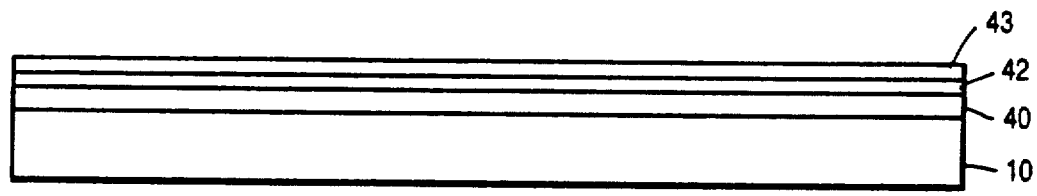
FIGS. 2A to 2E are a series of vertical sectional views of the devices depicted in FIGS. 1A and 1B during their formation.
Figure 2B:
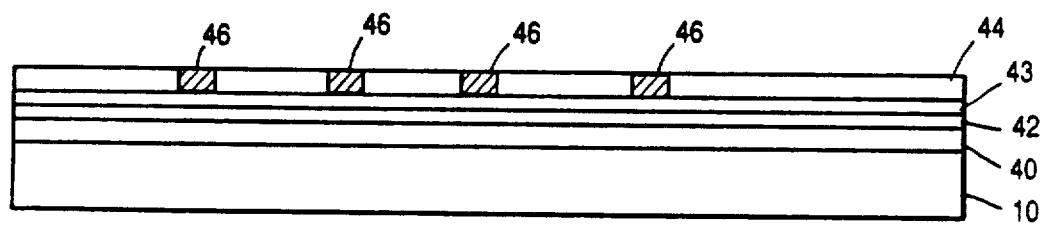
Figure 2C:
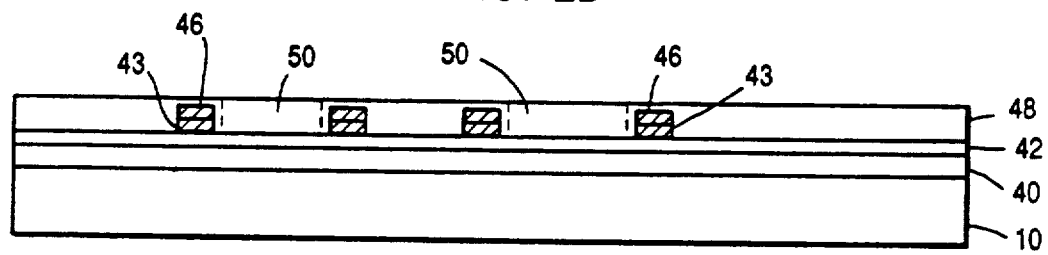
Figure 2D:
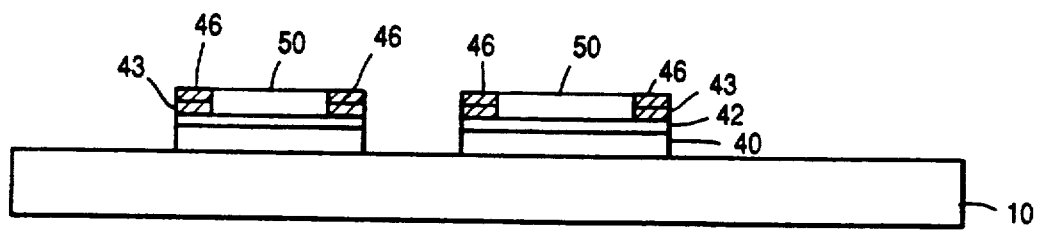

The undeveloped photoresist 48, i.e. the unexposed photoresist which extends over all of the surface of the device except the area where the resistors 30 are located, is then removed, followed by removal of the Ti layer 42 and the tantalum nitride layer 40 which are not protected by the areas of exposed photoresist 50 or the gold layer 46 (see FIG. 2D).

Figure 2E:
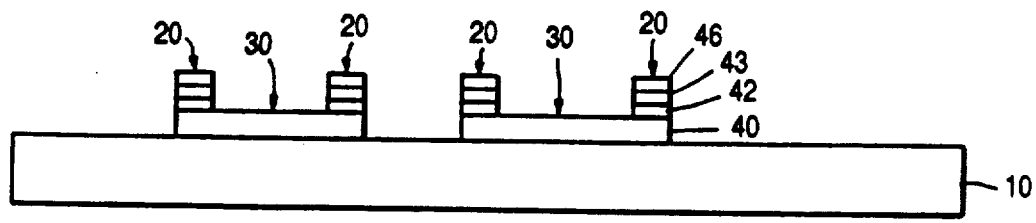

The remaining photoresist 50 is then removed and the Ti layer 42 in the areas not covered by the layer of gold 46 is removed (see FIG. 2E). This leaves the layers 40, 42 and 43 under the gold 46 and the portion of the tantalum nitride layer 40 under the exposed resist 50 intact to define the spiral turns 20 and the inter-turn resistances 30.

Figure 1C:
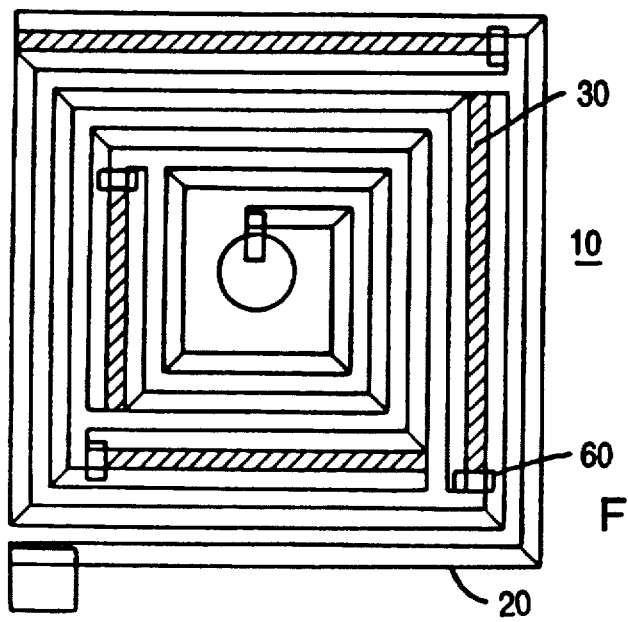
FIGS. 1C and 1D are plan views of the rectangular spiral conductor and the circular spiral conductor depicted in 1A and 1B, respectively, also showing shorts across the resistive links.
Figure 1D:
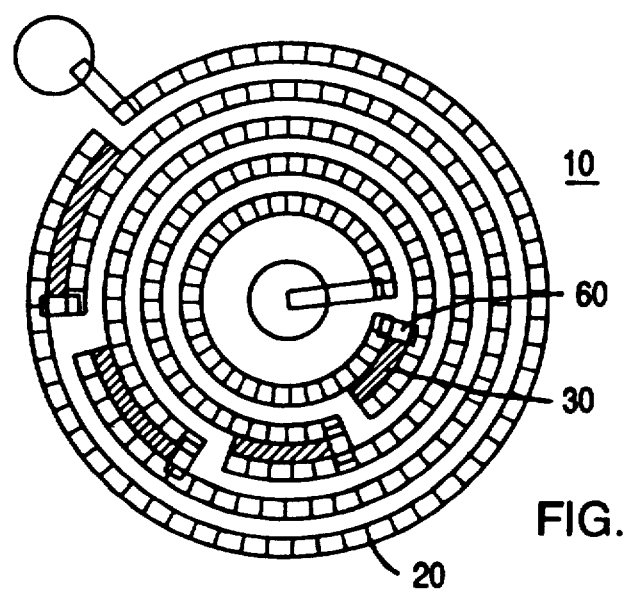

In a preferred embodiment DC resistance is eliminated by printing shorts 60 across the resistive links 30. (See FIGS. 1C and 1D). The shorts 60 cause an increase in Q at low frequency where self resonance is negligible and cause a decrease in Q at high frequencies by suppressing the resonance.

Finally, the device is heat treated at approximately 450° C. to stabilize the resistors 30 to have a resistivity of approximately 60 $\Omega/\square$. The resistance of the resistive links 30 between the windings of the spiral 20 is about 2 to 8 $\Omega$.

Although the present invention has been shown and described with respect to preferred embodiments, various changes and modifications which are obvious to a person skilled in the art to which the invention pertains are deemed to lie within the spirit and scope of the invention.

What is claimed is:

1. A method of forming a thin film printed circuit inductive element comprising the steps of:
   a. forming a layer of conducting material on a planar surface of an insulating substrate in a spiral path by depositing a layer of titanium, a layer of platinum and a layer of electroplated gold; and b. forming on the planar surface a plurality of resistive links which connect adjacent turns of the spiral path.

2. A method of forming a thin film printed circuit inductive element comprising the steps of:
   a. forming a layer of conducting material on a planar surface of an insulating substrate in a spiral path by depositing a layer of titanium/platinum alloy and a layer of electroplated gold; and
   b. forming on the planar surface a plurality of resistive links which connect adjacent turns of the spiral path.

3. A method of forming a thin film printed circuit inductive element comprising the steps of:
   (a) depositing a layer of resistive material on the planar surface of the substrate;
   (b) depositing a first metallic layer on top of the resistive material layer;
   (c) depositing a second metallic layer on top of the first metallic layer;
   (d) depositing a first layer of photoresist on top of the second metallic layer;
   (e) exposing a portion of the first photoresist layer to light through a spiral pattern;
   (f) removing a portion of the first photoresist layer, which is not exposed to light through the spiral pattern, to form a spiral pattern in the first photoresist layer over the second metallic layer;
   (g) depositing a third metallic layer in the spiral pattern formed in the first photoresist layer;
   (h) removing the remaining portion of the first photoresist layer;
   (i) removing the exposed portion of the second metallic layer;
   (j) depositing a second layer of photoresist over the entire surface of the device;
   (k) exposing the second photoresist layer to light through a pattern which allows light to impinge on areas of the second photoresist layer located between the turns of the spiral pattern formed in step (f);
   (l) removing the undeveloped portions of the second photoresist layer, i.e. the unexposed photoresist which extends over all of the surface of the device except the areas exposed in step (i);
   (m) removing the portion of the first metallic layer and the resistive layer which are not protected by the exposed areas of the second photoresist layer or the third metallic layer; and
   (n) removing the remaining portions of the second photoresist layer and all portions of the first metallic layer in the areas not covered by the third metallic layer.

4. A method of forming a thin film printed circuit inductive element according to claim 3, wherein the step of depositing the resistive material layer comprises the step of depositing a layer of tantalum nitride.

5. A method of forming a thin film printed circuit inductive element according to claim 3, wherein the step of depositing the first metallic layer comprises the step of depositing a layer of titanium.

6. A method of forming a thin film printed circuit inductive element according to claim 3, wherein the step of depositing the second metallic layer comprises the step of depositing a layer platinum.

7. A method of forming a thin film printed circuit inductive element according to claim 3, wherein the step of depositing the third metallic layer comprises the step of electroplating a layer of gold on top of the second metallic layer.

8. A method of forming a thin film printed circuit inductive element comprising the steps of:
   (a) forming a layer of conducting material on a planar surface of an insulating substrate in a spiral path;
   (b) forming on the planar surface a plurality of resistive links which connect adjacent turns of the spiral path by depositing a layer of tantalum nitride.

9. A method of forming a thin film printed circuit inductive element according to claim 8, wherein the step of forming the resistive links comprises the step of heating the layer of tantalum nitride and the planar surface to approximately 450° C. until the layer of tantalum nitride has a resistivity of approximately 60 Ω/□.

* * * * *

UNITED STATES PATENT AND TRADEMARK OFFICE
CERTIFICATE OF CORRECTION

PATENT NO. : 5,215,866
DATED : June 1, 1993
INVENTOR(S) : Marshall Maple

It is certified that error appears in the above-indentified patent and that said Letters Patent is hereby corrected as shown below:

In the Claims:

Column 4, line 15, change "resistive material layer" to
-- layer of resistive material --.

Column 4, line 16, change "tantalum nitride" to
-- titanium --.

Column 4, line 20, change "titanium" to
-- tantalum nitride --.

Signed and Sealed this

Sixteenth Day of May, 1995

Attest:

BRUCE LEHMAN

*Attesting Officer*  *Commissioner of Patents and Trademarks*